(12) United States Patent
Tsukamoto

(10) Patent No.: US 8,266,773 B2
(45) Date of Patent: Sep. 18, 2012

(54) METHOD OF MANUFACTURING A PIEZOELECTRIC ACTUATOR

(75) Inventor: Ryuji Tsukamoto, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 319 days.

(21) Appl. No.: 12/568,397

(22) Filed: Sep. 28, 2009

(65) Prior Publication Data

US 2010/0079554 A1     Apr. 1, 2010

(30) Foreign Application Priority Data

Sep. 29, 2008  (JP) ................. 2008-250606

(51) Int. Cl.
*H04R 17/10* (2006.01)
*H01L 41/24* (2006.01)

(52) U.S. Cl. ............ 29/25.35; 29/846; 252/62.9 PZ; 310/358; 310/359; 310/365

(58) Field of Classification Search ............ 29/25.35, 29/846, 847, 842; 252/62.9 R, 62.9 PZ; 310/328, 310/330, 358, 359, 365, 326
See application file for complete search history.

(56) References Cited

U.S. PATENT DOCUMENTS

| 5,004,555 | A | * | 4/1991 | Cheng et al. | ............. | 252/62.9 R |
| 5,058,250 | A | * | 10/1991 | Turnbull | ............... | 29/25.35 |
| 6,153,966 | A | * | 11/2000 | Neukermans | ............ | 310/328 |
| 7,323,073 | B2 | * | 1/2008 | Minami et al. | ........ | 252/62.9 PZ |
| 7,439,659 | B2 | * | 10/2008 | Tsukamoto | ............ | 310/365 X |

FOREIGN PATENT DOCUMENTS

| JP | 6-342946 A | | 12/1994 |
| JP | 08293632 A | * | 11/1996 |

* cited by examiner

*Primary Examiner* — A. Dexter Tugbang
(74) *Attorney, Agent, or Firm* — Sughrue Mion, PLLC

(57) ABSTRACT

A method of manufacturing a piezoelectric actuator includes a first polarization of a piezoelectric body; polishing the piezoelectric body; first heating step of heating the piezoelectric body to a temperature which is not lower than a Curie point of the piezoelectric body and performing a re-polarization of the piezoelectric body in a second polarization of the piezoelectric body having been heated in the first heating step.

5 Claims, 10 Drawing Sheets

METHOD OF MANUFACTURING A PIEZOELECTRIC ACTUATOR

BACKGROUND OF THE INVENTION

1. Field of the Invention

The present invention relates to a method of manufacturing a piezoelectric actuator including a piezoelectric device constituted of a lower electrode, a piezoelectric body and an upper electrode arranged on a diaphragm, a liquid ejection head including this piezoelectric actuator, and an image forming apparatus including this liquid ejection head.

2. Description of the Related Art

In general, an inkjet recording apparatus performs recording by ejecting and depositing droplets of ink onto a recording medium from nozzles of a recording head (inkjet head), and such a method is able to record images of high resolution and high quality, with little noise during the recording operation and low running costs, and therefore is widely used in a variety of fields. As an ink ejection method, it is desirable to use a method which ejects an ink droplet from a nozzle connected to a pressure chamber by pressing ink inside the pressure chamber by using the displacement of a piezoelectric element, for example, to move the wall surface of the pressure chamber.

It is known that if a piezoelectric element is driven for a long time, then the displacement properties of the element decline. As a method for restoring the decline of the piezoelectric properties of a piezoelectric element due to such use, Japanese Patent Application Publication No. 06-342946, for instance, proposes a method whereby the piezoelectric element is subjected to an annealing process at a temperature not lower than the Curie point of the piezoelectric material.

However, in the method described in Japanese Patent Application Publication No. 06-342946, although it is possible to eliminate decline in the displacement properties of the piezoelectric element by carrying out the annealing of the piezoelectric element after the element has been driven for a long period of time, since the restoration process is ultimately required after decline in displacement has occurred, then there is a problem in that the piezoelectric element is driven in a state of degraded displacement properties over a long period of time.

In particular, in a process of manufacturing an inkjet head, when the piezoelectric body is subjected to polishing and heat treatment, there is marked decline in the displacement properties of the piezoelectric element and this gives rise to degradation in the image due to the occurrence of fluctuations in the ink ejection properties.

SUMMARY OF THE INVENTION

The present invention has been contrived in view of these circumstances, an object thereof being to provide a method of manufacturing a piezoelectric actuator, a liquid ejection head and an image forming apparatus whereby the durability and initial characteristics of the piezoelectric element are improved.

In order to attain the aforementioned object, the present invention is directed to a method of manufacturing a piezoelectric actuator which includes a piezoelectric device constituted of a lower electrode, a piezoelectric body and an upper electrode arranged on a diaphragm, the method comprising: a polishing step of polishing the piezoelectric body; and a first heating step of heating the piezoelectric body to a temperature which is not lower than a Curie point of the piezoelectric body and performing re-polarization of the piezoelectric body having been polished in the polishing step.

According to this aspect of the present invention, by heating the piezoelectric body to the temperature not lower than the Curie temperature and performing re-polarization before starting to use the piezoelectric element, it is possible to drive the piezoelectric element without the occurrence of decline in the displacement properties over a long period of time, and it is possible to improve the durability and initial characteristics of the piezoelectric element.

Preferably, the method further comprises a second heating step of heating the piezoelectric body before the first heating step to a temperature which is not lower than 100° C. and is lower than the Curie point of the piezoelectric body.

According to this aspect of the present invention, if the piezoelectric body is heated to a temperature not lower than 100° C. and lower than the Curie point, then an effect in reducing the displacement properties is obtained in comparison with a case where this second heating is not carried out, but by heating the piezoelectric body to a temperature not lower than the Curie point, it is possible to cancel out this effect and more desirable effects can be achieved in the present invention.

For example, the second heating step includes the step of forming the upper electrode on the piezoelectric body.

In order to attain the aforementioned object, the present invention is also directed to a method of manufacturing a piezoelectric actuator which includes a piezoelectric device constituted of a lower electrode, a piezoelectric body and an upper electrode arranged on a diaphragm, the method comprising: a first heating step of heating the piezoelectric body to a temperature which is not lower than a Curie point of the piezoelectric body and performing re-polarization of the piezoelectric body; and a second heating step of heating the piezoelectric body before the first heating step to a temperature which is not lower than 100° C. and is lower than the Curie point of the piezoelectric body.

According to this aspect of the present invention, if the piezoelectric body is heated to a temperature not lower than 100° C. and lower than the Curie point, then an effect in reducing the displacement properties is obtained in comparison with a case where the heating is not carried out, but by heating the piezoelectric body to a temperature not lower than the Curie point, it is possible to cancel out this effect and more desirable effects can be achieved in the present invention.

Furthermore, in order to attain the aforementioned object, the present invention is also directed to a liquid ejection head comprising the piezoelectric actuator which is manufactured by the above-described method.

According to this aspect of the present invention, it is possible to improve the ejection stability of the liquid ejection head.

Furthermore, in order to attain the aforementioned object, the present invention is also directed to an image forming apparatus comprising the above-described liquid ejection head.

According to this aspect of the present invention, it is possible to achieve improvement in image quality and a desirable image can be obtained in the image forming apparatus.

According to the present invention, by heating the piezoelectric body to a temperature not lower than the Curie temperature and performing re-polarization before starting to use the piezoelectric element in this way, it is possible to drive the piezoelectric element without the occurrence of decline in the displacement properties over a long period of time, and it is possible to improve the durability and initial characteristics of the piezoelectric element.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

Figure 1:
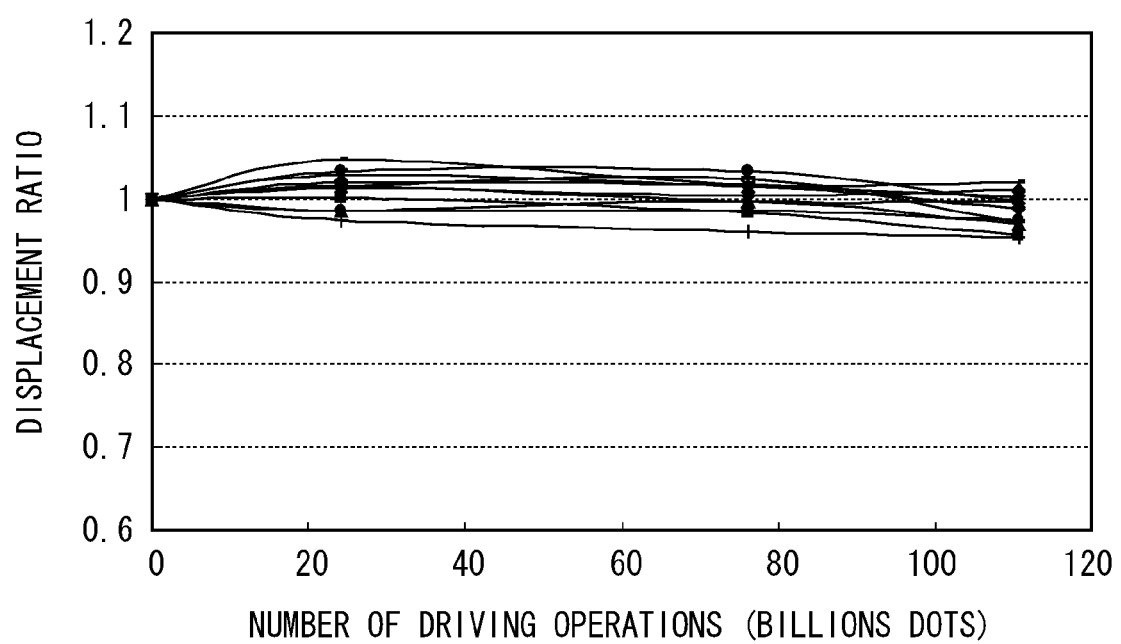
FIG. 1 is a graph showing the relationship between the number of driving operations and the displacement ratio in a case where annealing is carried out at a temperature not lower than the Curie point of the piezoelectric body.
Figure 2:
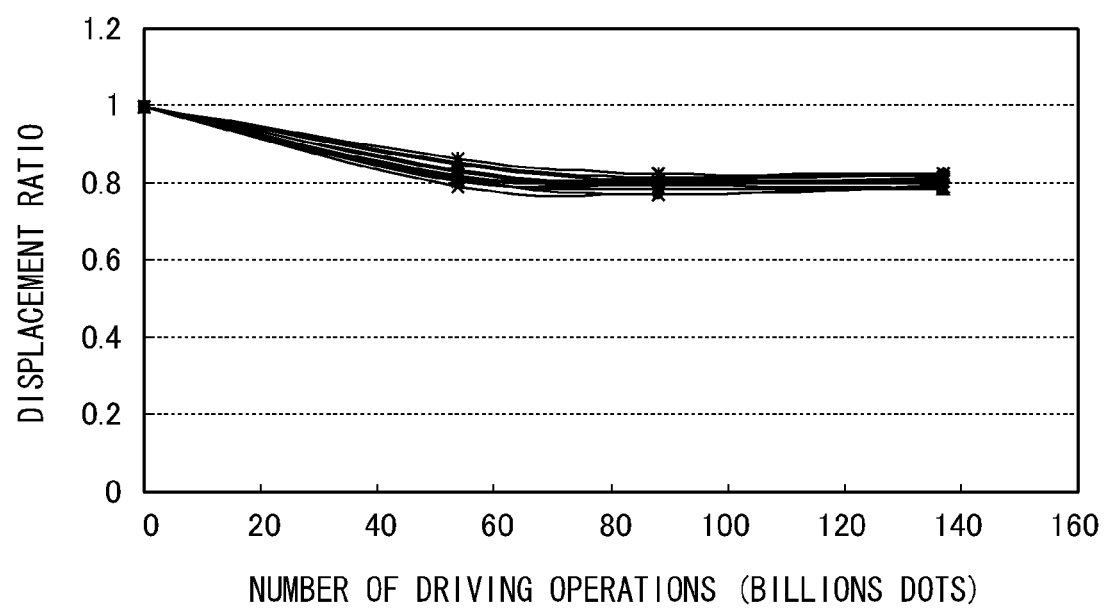
FIG. 2 is a graph showing the relationship between the number of driving operations and the displacement ratio in a case where the piezoelectric body is not subjected to an annealing process.
Figure 3:
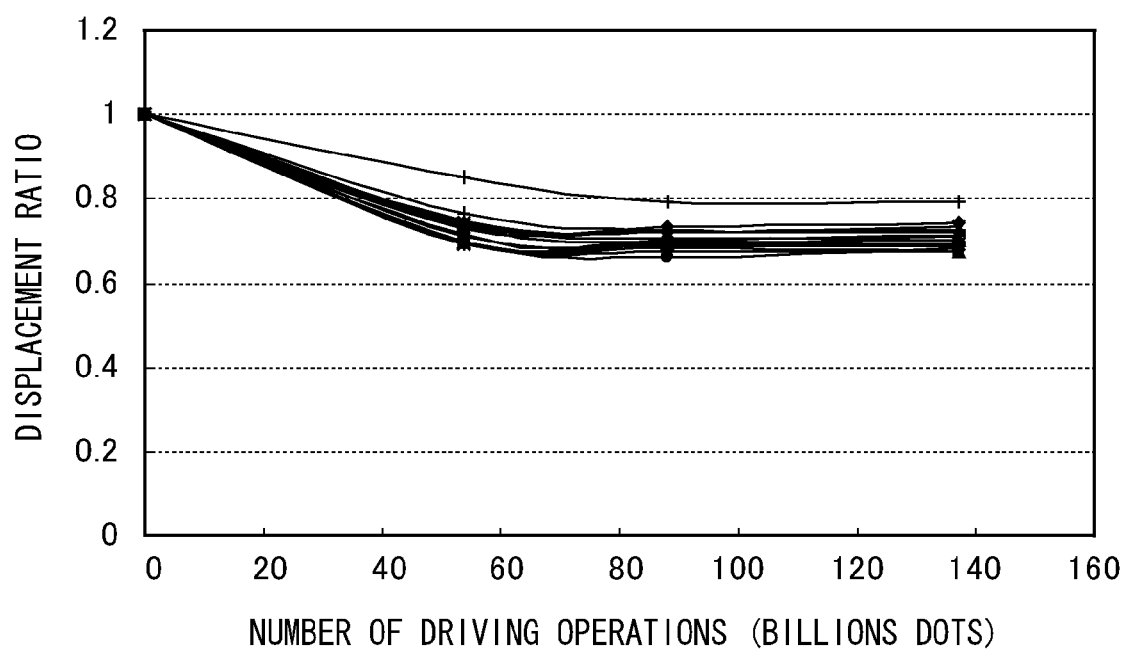
FIG. 3 is a graph showing the relationship between the number of driving operations and the displacement ratio in a case where annealing is carried out at a temperature (100° C.) lower than the Curie point of the piezoelectric body.

FIG. 1 shows the relationship between the number of driving operations of the piezoelectric element and the displacement ratio in a case where the piezoelectric body is subjected to an annealing process at a temperature lower than the Curie point of the piezoelectric body and re-polarization is performed, before starting the use of the piezoelectric element. FIG. 2 shows, by way of a comparative example, a case where the aforementioned annealing process is not carried out and re-polarization is not performed. FIG. 3 shows a case where the piezoelectric body is subjected to annealing at a temperature of 100° C. and re-polarization is not performed. In each of these drawings, the horizontal axis represents the number of drive operations of piezoelectric elements and the vertical axis represents the displacement ratio if the initial state is taken as 1, and the curves show data obtained by repeatedly driving the piezoelectric elements a plurality of times under the same condition.

As shown in FIG. 1, in a case where the piezoelectric body is heated to a temperature not lower than the Curie point of the piezoelectric body and re-polarization is carried out before the start of use of the piezoelectric element, even if the piezoelectric element is driven 100,000 million times or more, the displacement ratio with respect to the initial state is 0.95 (95%) or above, and hence there is virtually no decline in the displacement properties of the piezoelectric element.

As opposed to this, if the piezoelectric body is not heated, as shown in FIG. 2, when the piezoelectric element has been driven 60,000 million times or more, the displacement ratio with respect to the initial state is approximately 0.80 (80%) and there is large decline in the displacement properties of the piezoelectric element compared to the case shown in FIG. 1.

Therefore, in the embodiment of the present invention, before starting to use the piezoelectric element, the piezoelectric body is heated to a temperature not lower than the Curie point and re-polarization is carried out. Thus, it is possible to drive the piezoelectric element without giving rise to decline in the displacement properties and it is possible to improve the durability and the initial characteristics of the piezoelectric element.

Furthermore, as shown in FIG. 3, if the piezoelectric body is heated to a temperature of 100° C., when the piezoelectric element has been driven 60,000 million times or more, the displacement ratio with respect to the initial state becomes around 0.70 (70%), which shows a decline in displacement of around 10% in comparison with the case where the annealing process shown in FIG. 2 is not performed. This is thought to be because if the piezoelectric body is heated to a temperature not lower than 100° C. and lower than the Curie point, then de-polarization of the piezoelectric body starts and this has the effect of causing a decline in the displacement properties.

Therefore, if the piezoelectric body has been subjected to heating which gives rise to a decline in displacement of this kind, then by heating the piezoelectric body to a temperature not lower than the Curie point and performing re-polarization, it is possible to cancel out this effect and a more desirable beneficial effect can be achieved.

Furthermore, a piezoelectric body which has undergone polishing suffers de-polarization and fluctuation in the domain directions in the vicinity of the surface of the piezoelectric body, due to the stress and heat generated by the polishing process, and this has the effect of reducing the displacement properties of the piezoelectric element. In a case of this kind as well, by applying the embodiment of the present invention as described above, it is possible to cancel out this effect and more desirable beneficial effects can be achieved.

Below, the composition of an inkjet head (hereinafter referred to as a recording head) including piezoelectric actuators manufactured by the method of manufacturing a piezoelectric actuator according to the embodiment of the present invention is described, whereupon the method of manufacturing a recording head (including a method of manufacturing a piezoelectric actuator) is described.

Composition of Inkjet Head

Figure 4:
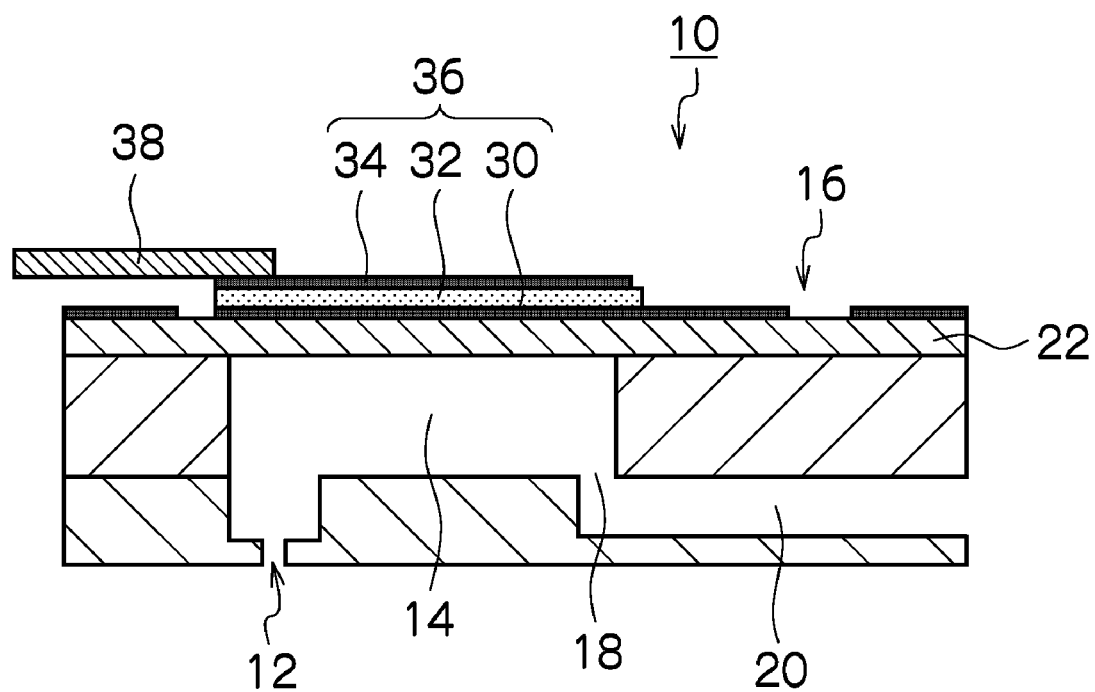
FIG. 4 is a diagram showing a recording head according to an embodiment of the present invention.

FIG. 4 is a diagram showing a cross-sectional view of a recording head according to an embodiment of the present invention. As shown in FIG. 4, the recording head 10 according to the present embodiment includes: a nozzle 12, which forms an ink ejection port; a pressure chamber 14, which is connected to the nozzle 12; and a piezoelectric actuator 16, which alters the internal volume of the pressure chamber 14.

Although not shown in FIG. 4, there are a plurality of the nozzles 12 arranged in a two-dimensional arrangement (matrix configuration) in the ejection face (nozzle surface) of the recording head 10. The pressure chambers 14 corresponding respectively to the nozzles 12 are arranged inside the recording head 10, and each nozzle 12 is connected to the corresponding pressure chamber 14. Ink supply ports 18 are formed respectively at ends of the pressure chambers 14 (the ends on the opposite sides to the sides where the nozzles 12 are connected in FIG. 4). The pressure chambers 14 are connected to a common flow channel 20 through the ink supply ports 18, and the ink inside the common flow channel 20 is thereby distributed and supplied to the pressure chambers 14. Ink is supplied to the common flow channel 20 from an ink tank (not shown), which is disposed in an ink storing and loading unit 214 shown in FIG. 6.

The piezoelectric actuator 16 shown in FIG. 4 has a lower electrode 30 deposited on a diaphragm 22 constituting a wall of the pressure chamber 14 (the upper face in FIG. 4), a piezoelectric body 32 deposited on the lower electrode 30, and an upper electrode 34 deposited on the piezoelectric body 32, and the piezoelectric actuator 16 is formed at a position corresponding to each of the pressure chambers 14. The lower electrode 30, the piezoelectric body 32 and the upper electrode 34 corresponding to each of the pressure chambers 14 constitute the piezoelectric element 36, which serves as a pressure generating device to apply pressure to the ink inside each pressure chamber 14.

Each of the lower electrode 30 and the upper electrode 34 is made of an electrode material such Ir, Pt and Ti, and is arranged at the position corresponding to each pressure chamber 14 as described above.

The piezoelectric actuator 16 in the present embodiment has a structure in which the lower electrode 30 is a common electrode, and the upper electrode 34 is an individual electrode (i.e., an upper address structure). The upper electrode 34 is connected to an external wire (e.g., a flexible cable) 38. On the other hand, the lower electrodes 30 corresponding to the respective pressure chambers 14 are connected electrically to each other at a position that is not illustrated, and they are earthed.

In a mode where the lower electrode 30 is a common electrode, it is possible to form the lower electrode 30 over the whole surface of the diaphragm 22.

When a prescribed drive signal is supplied to the upper electrode (individual electrode) 34 of the piezoelectric element 36 from a head driver 284 (not shown in FIG. 4, and shown in FIG. 8) through the external wire 38, thereby an electric field is applied to the piezoelectric body 32 disposed between the lower electrode 30 and the upper electrode 34, the diaphragm 22 deforms so as to project toward the pressure chamber 14 side due to the expansion and contraction of the piezoelectric body 32. Consequently, the ink inside the pressure chamber 14 is applied with pressure and an ink droplet is ejected from the nozzle 12 connected to the pressure chamber 14. When the diaphragm 22 returns to its original state after the ejection of ink, new ink is supplied to the pressure chamber 14 from the common flow channel 20 through the ink supply port 18, thus preparing for the next ink ejection operation.

Method of Manufacturing Inkjet Head

Next, a method of manufacturing the piezoelectric actuator according to an embodiment of the present invention is described. FIGS. 5A to 5L are cross-sectional diagrams showing the steps of the method of manufacturing the recording head 10 including the method of manufacturing the piezoelectric actuator according to the embodiment of the present invention.

Figure 5A:
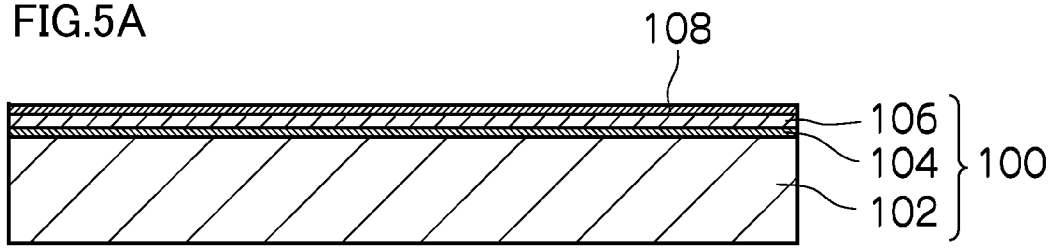
FIGS. 5A to 5L are cross-sectional diagrams showing the steps of a method of manufacturing the recording head.

Firstly, an SOI (silicon on insulator) substrate 100 having an insulating layer 108 formed on the surface thereof is prepared (FIG. 5A). The SOI substrate 100 is a multiple-layer substrate, which has a supporting layer 102 constituted of a silicon (Si) substrate, a box layer 104 constituted of a silicon oxide ($SiO_2$) film, and an active layer 106 constituted of a silicon (Si) substrate. The insulating layer 108 is a silicon oxide ($SiO_2$) film, and is formed for instance by a thermal oxidation method, a sputtering method, or a chemical vapor deposition (CVD) method. As the material of the insulating layer 108, it is also possible to use another oxide such as $ZrO_2$, $Al_2O_3$, or the like, a nitride, such as SiCN, TiAlN, $Si_3N_4$, TiAlCrN, or the like, an oxynitride, such as SiON, or a resin.

Figure 5B:
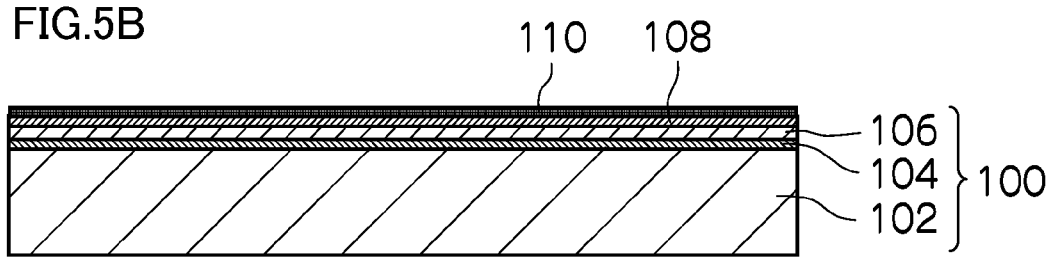
Figure 5C:
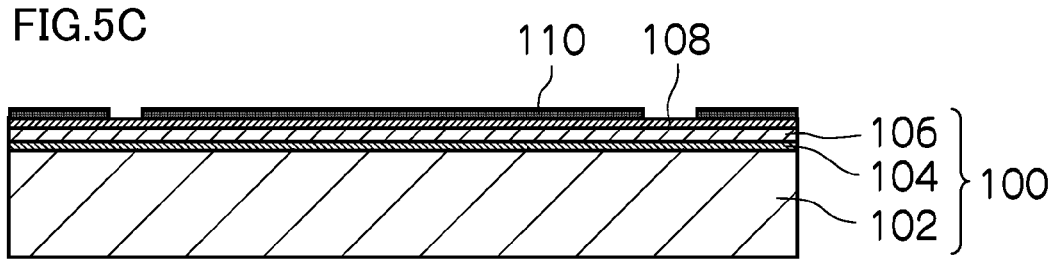

Next, a lower electrode 110 is formed as film over the whole surface of the insulating layer 108 (FIG. 5B). The material of the lower electrode 110 is an electrode material such as Ir, Pt and Ti. The method of forming the lower electrode 110 can be sputtering, vapor deposition, CVD or the like. The thickness of the lower electrode 110 is 100 nm to 300 nm, for example. Subsequently, the lower electrode 110 is patterned by etching (FIG. 5C). More specifically, the lower electrode 110 is divided into individual areas for the respective pressure chambers 14 (see FIG. 4) by dry etching (RIE). Instead of forming the solid lower electrode 110 over the insulating layer 108 and then etching, it is also possible to form pieces of lower electrodes 110 at positions corresponding to the respective pressure chambers 14, by means of a lift-off film deposition method which uses a resist.

Figure 5D:
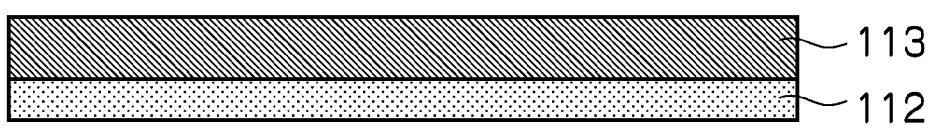
Figure 5E:
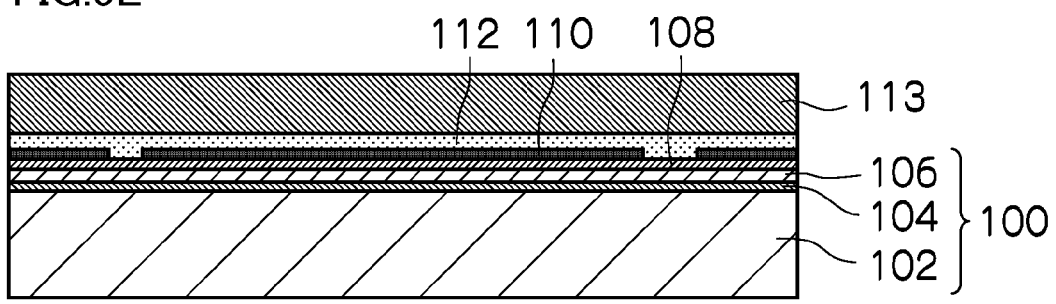

Next, a bulk piezoelectric body 112 made of lead zirconate titanate ($Pb(Zr, Ti)O_3$) or the like having a sacrificial layer 113 formed on one surface thereof is prepared, and the other surface of the piezoelectric body 112 is polished to achieve a desired thickness (for example, 25 μm) (FIG. 5D).

When the piezoelectric body 112 is polished, de-polarization and fluctuation of the domain direction of the piezoelectric body 112 in the vicinity of the surface of the piezoelectric body 112 occurs due to the stress and heat generated during the polishing, and there is a problem in that marked decline in the displacement properties occurs when the piezoelectric element 36 (see FIG. 4) is driven for a long period of time. Therefore, in the method of manufacture according to the present embodiment, by subjecting the piezoelectric body 112 to annealing at a temperature not lower than the Curie point of the piezoelectric body 112 and performing re-polarization, as described below, the decline in the displacement of the piezoelectric element 36 is restored and the problems described above are eliminated effectively.

Figure 5F:
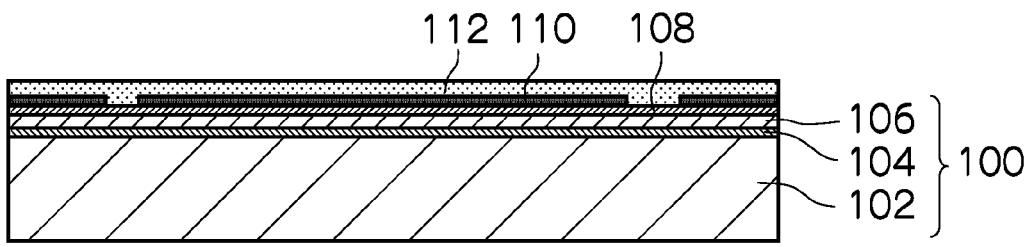

Next, the piezoelectric body 112 having the aforementioned sacrificial layer 113 formed thereon is bonded to the surface of the SOI substrate 100 shown in FIG. 5C on the side where the lower electrode 110 is formed (FIG. 5E), whereupon the sacrificial layer 113 is removed (FIG. 5F).

Figure 5G:
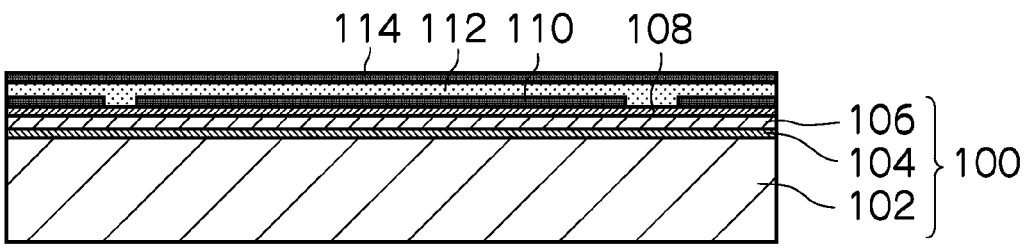

Next, an upper electrode 114 is formed as film over the whole surface of the piezoelectric body 112 (FIG. 5G). The material of the upper electrode 114 is an electrode material such as Ir, Pt, Ti and Au. The method of forming the upper electrode 114 can be sputtering, vapor deposition, CVD or the like. The thickness of the upper electrode 114 is 100 nm to 300 nm, for example.

Next, the piezoelectric body 112 is subjected to annealing at a temperature not lower than the Curie point of the piezoelectric body 112 and re-polarization is performed. The re-polarization conditions are, for instance: applying an electric field of approximately 4 kV/mm to the piezoelectric body 112 for approximately 1 minute. By heating the piezoelectric body 112 to the temperature not lower than the Curie point and performing the re-polarization before starting to use the piezoelectric element 36 in this way, it is possible to drive the piezoelectric element 36 without the occurrence of decline in the displacement properties over a long period of time.

Figure 5H:
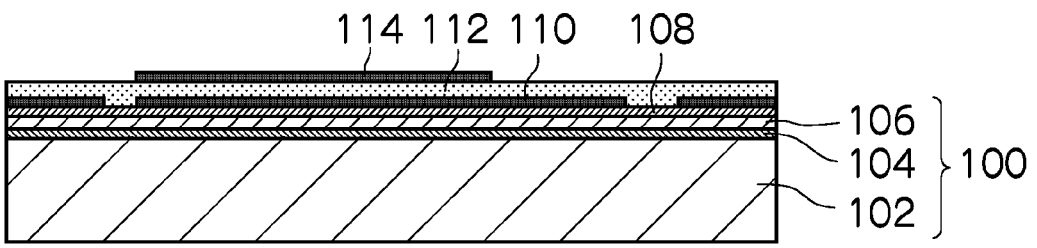

Subsequently, the upper electrode 114 is patterned by etching (FIG. 5H). More specifically, the upper electrode 114 is patterned by dry etching (RIE) using a fluoride or chloride gas. Instead of forming the solid upper electrode 114 over the piezoelectric body 112 and then etching, it is also possible to form the upper electrode 114 on the piezoelectric body 112 by means of a lift-off film deposition method which uses a resist.

Figure 5I:
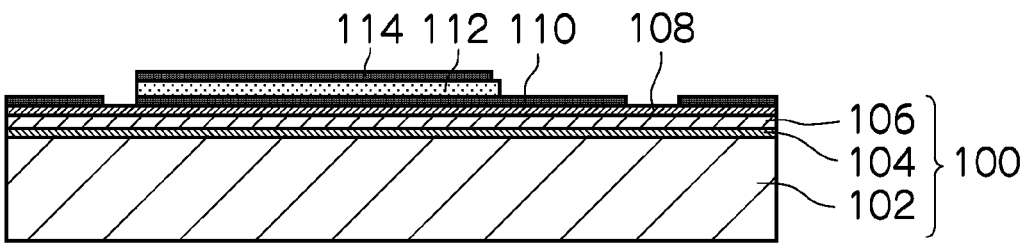
Figure 5J:
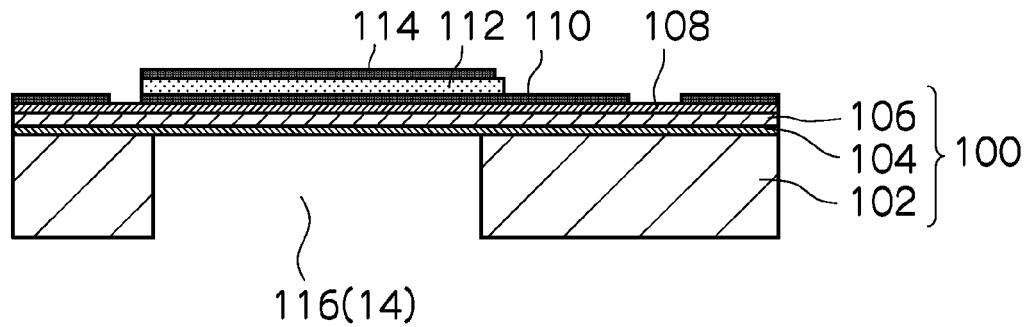

Next, the piezoelectric body 112 is patterned by etching (FIG. 5I). More specifically, the piezoelectric body 112 is patterned by dry etching (RIE) using a fluoride or chloride gas, similarly to the upper electrode 114. In this case, it is desirable that the piezoelectric body 112 is removed by the etching so as not to remain on the insulating layer 108, thereby preventing the piezoelectric body 112 from pealing off. Although not shown in the drawings, there is also a mode where the upper electrode 114 and the piezoelectric body 112 are simultaneously etched.

Figure 5K:
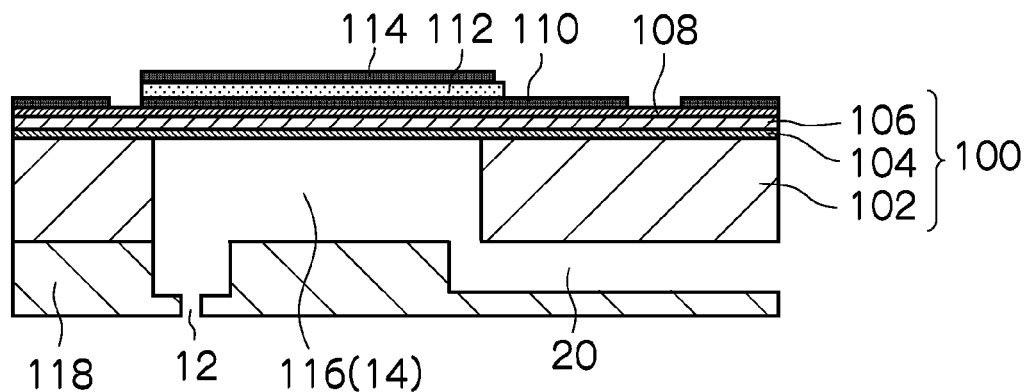

Thereupon, an opening 116, which serves as the pressure chamber 14, is formed on the supporting body (silicon substrate) 102 of the SOI substrate 100, on the lower surface thereof in the drawing (FIG. 5J) by etching, for example. Subsequently, a flow channel forming substrate 118 in which the nozzles 12 and the common flow channel 20 are formed is bonded to the lower surface side of the SOI substrate 100 (FIG. 5K).

Figure 5L:
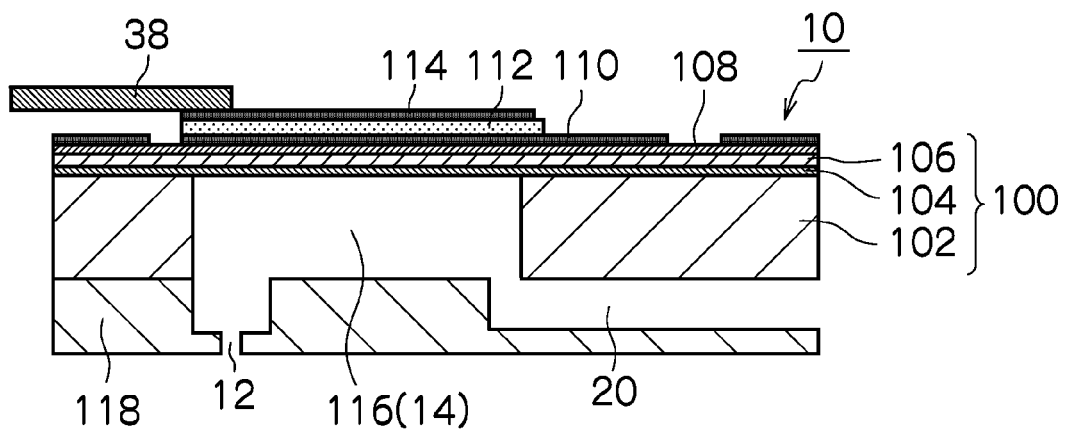

Finally, an end of the external wire 38 is bonded to the upper electrode 114 with an electrically conductive adhesive, and the recoding head 10 according to the present embodiment is thus obtained (FIG. 5L).

In the method of manufacture according to the present embodiment, by heating the piezoelectric body 112 to a temperature not lower than the Curie point of the piezoelectric body 112 and performing re-polarization before starting to use the piezoelectric element 36 in this way, it is possible to drive the piezoelectric element 36 without the occurrence of decline in the displacement properties over a long period of time, and it is possible to improve the durability and initial characteristics of the piezoelectric element 36.

Furthermore, the present method of manufacture is especially beneficial in a case where a step of heating the piezoelectric body 112 to a temperature which is not lower than 100° C. and is lower than the Curie point of the piezoelectric body 112 (for example, in a step of polishing the piezoelectric body 112 or a step of depositing the upper electrode 114, or the like) is included in a preliminary step to the step of heating the piezoelectric body 112 to a temperature which is not lower than the Curie point and performing re-polarization. As described with reference to FIGS. 1 to 3, when the piezoelectric body 112 is heated to a temperature not lower than 100° C. and lower than the Curie point, an effect in reducing the displacement properties occurs in comparison with a case where the piezoelectric body 112 is not heated, but by heating the piezoelectric body 112 to a temperature not lower than the Curie point and performing re-polarization, it is possible effectively to cancel out this effect.

Furthermore the present method of manufacture is especially beneficial in a case where a step of polishing a bulk piezoelectric body 112 is included. By heating the piezoelectric body 112 to a temperature not lower than the Curie point and performing re-polarization, although an effect in reducing the displacement properties occurs due to the stress and heat generated during the polishing, this effect can be cancelled out effectively by heating the piezoelectric body 112 to a temperature not lower than the Curie point and performing re-polarization.

Composition of Image Forming Apparatus

Next, an inkjet recording apparatus which is an embodiment of the image forming apparatus according to the present invention is described.

Figure 6:
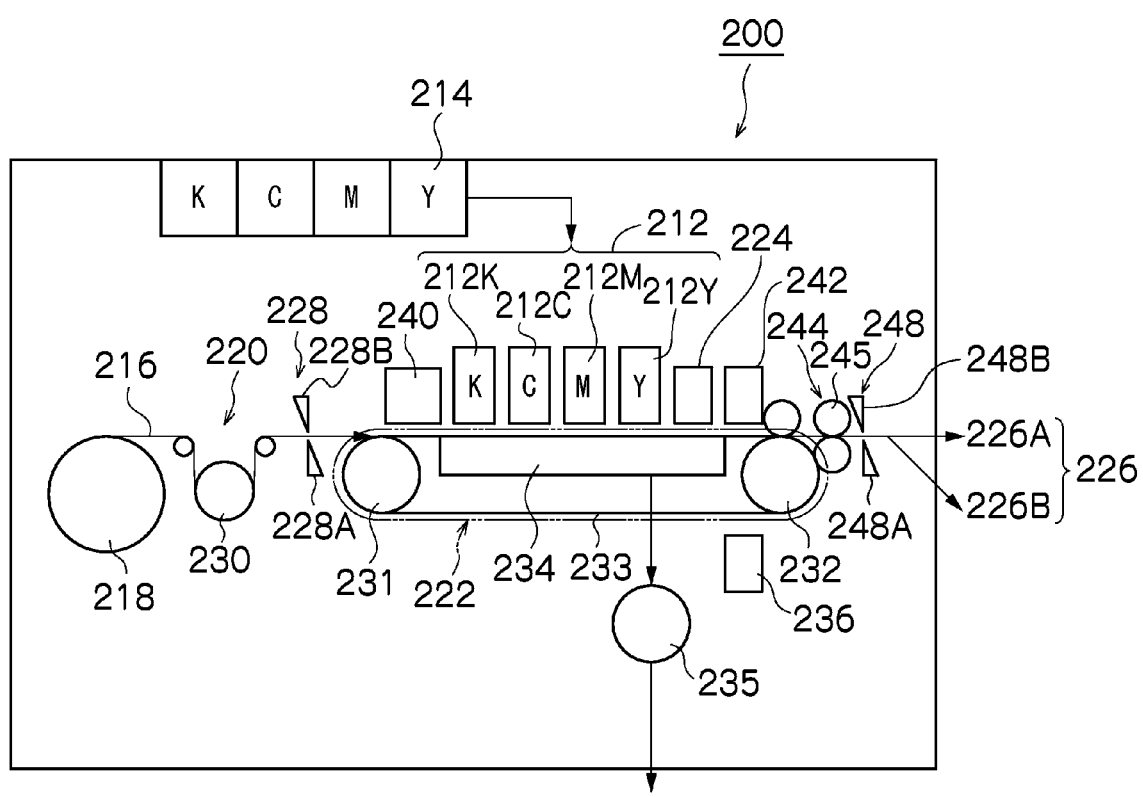
FIG. 6 is a general schematic drawing showing an inkjet recording apparatus according to an embodiment of the present invention.

FIG. 6 is a diagram of the general composition showing an outline of the inkjet recording apparatus 200. As shown in FIG. 6, the inkjet recording apparatus 200 includes: a printing unit 212 having a plurality of recording heads 212K, 212C, 212M, and 212Y for ink colors of black (K), cyan (C), magenta (M), and yellow (Y), respectively; the ink storing and loading unit 214 for storing inks of K, C, M and Y to be supplied to the recording heads 212K, 212C, 212M, and 212Y; a paper supply unit 218 for supplying recording paper 216; a decurling unit 220 for removing curl in the recording paper 216; a suction belt conveyance unit 222 disposed facing the nozzle face (ink-droplet ejection face) of the printing unit 212, for conveying the recording paper 216 while keeping the recording paper 216 flat; a print determination unit 224 for reading the printed result produced by the printing unit 212; and a paper output unit 226 for outputting image-printed recording paper (printed matter) to the exterior. Each of the recording heads 212K, 212C, 212M and 212Y corresponds to the recording head 10 shown in FIG. 1.

In FIG. 6, a magazine for rolled paper (continuous paper) is shown as an example of the paper supply unit 218; however, more magazines with paper differences such as paper width and quality may be jointly provided. Moreover, papers may be supplied with cassettes that contain cut papers loaded in layers and that are used jointly or in lieu of the magazine for rolled paper.

In the case of a configuration in which roll paper is used, a cutter 228 is arranged as shown in FIG. 6, and the roll paper is cut to a desired size by the cutter 228. The cutter 228 has a stationary blade 228A, whose length is not less than the width of the conveyor pathway of the recording paper 216, and a round blade 228B, which moves along the stationary blade 228A. The stationary blade 228A is disposed on the reverse side of the printed surface of the recording paper 216, and the round blade 228B is disposed on the printed surface side across the conveyance path. When cut paper is used, the cutter 228 is not required.

In the case of a configuration in which a plurality of types of recording paper can be used, it is preferable that an information recording medium such as a bar code and a wireless tag containing information about the type of paper is attached to the magazine, and by reading the information contained in the information recording medium with a predetermined reading device, the type of paper to be used is automatically determined, and ink-droplet ejection is controlled so that the ink-droplets are ejected in an appropriate manner in accordance with the type of paper.

The recording paper 216 delivered from the paper supply unit 218 retains curl due to having been loaded in the magazine. In order to remove the curl, heat is applied to the recording paper 216 in the decurling unit 220 by a heating drum 230 in the direction opposite from the curl direction in the magazine. The heating temperature at this time is preferably controlled so that the recording paper 216 has a curl in which the surface on which the print is to be made is slightly round outward.

The decurled and cut recording paper 216 is delivered to the suction belt conveyance unit 222. The suction belt conveyance unit 222 has a configuration in which an endless belt 233 is set around rollers 231 and 232 so that the portion of the endless belt 233 facing at least the nozzle face of the printing unit 212 and the sensor face of the print determination unit 224 forms a plane.

The belt 233 has a width that is greater than the width of the recording paper 216, and a plurality of suction apertures (not shown) are formed on the belt surface. A suction chamber 234 is disposed in a position facing the sensor surface of the print determination unit 224 and the nozzle surface of the printing unit 212 on the interior side of the belt 233, which is set around the rollers 231 and 232, as shown in FIG. 6. The suction chamber 234 provides suction with a fan 235 to generate a negative pressure, and the recording paper 216 is held on the belt 233 by suction.

The belt 233 is driven in the clockwise direction in FIG. 6 by the motive force of a motor (not shown) being transmitted to at least one of the rollers 231 and 232, which the belt 233 is set around, and the recording paper 216 held on the belt 233 is conveyed from left to right in FIG. 6.

Since ink adheres to the belt 233 when a marginless print job or the like is performed, a belt-cleaning unit 236 is disposed in a predetermined position (a suitable position outside the printing area) on the exterior side of the belt 233. Although the details of the configuration of the belt-cleaning unit 236 are not shown, examples thereof include a configuration in which the belt 233 is nipped with cleaning rollers such as a brush roller and a water absorbent roller, an air blow configuration in which clean air is blown onto the belt 233, or a combination of these. In the case of the configuration in which the belt 233 is nipped with the cleaning rollers, it is preferable to make the line velocity of the cleaning rollers different than that of the belt 233 to improve the cleaning effect.

The inkjet recording apparatus 200 may have a roller nip conveyance mechanism, in which the recording paper 216 is pinched and conveyed with nip rollers, instead of the suction belt conveyance unit 222. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 240 is disposed on the upstream side of the printing unit 212 in the conveyance pathway formed by the suction belt conveyance unit 222. The heating fan 240 blows heated air onto the recording paper 216 to heat the recording paper 216 immediately before printing so that the ink deposited on the recording paper 216 dries more easily.

Figure 7:
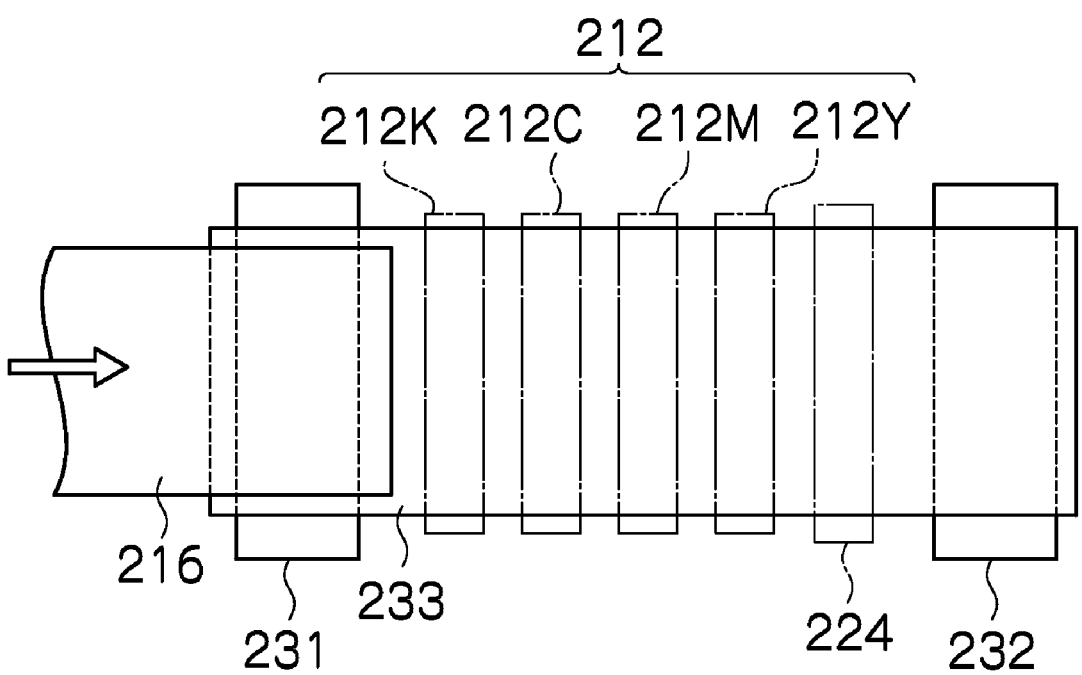
FIG. 7 is a principal plan diagram showing the peripheral area of a printing unit of the inkjet recording apparatus.

The printing unit 212 is a so-called "full line head" in which a line head having a length corresponding to the maximum paper width is arranged in a direction (main scanning direction) that is perpendicular to the paper conveyance direction (sub-scanning direction). The recording heads 212K, 212C, 212M and 212Y forming the printing unit 212 are constituted by line heads in which a plurality of ink ejection ports (nozzles) are arranged through a length exceeding at least one edge of the maximum size recording paper 216 intended for use with the inkjet recording apparatus 200 (see FIG. 7).

The recording heads 212K, 212C, 212M, and 212Y are arranged in the order of black (K), cyan (C), magenta (M), and yellow (Y) from the upstream side (from left in FIG. 6), along the conveyance direction of the recording paper 216 (paper conveyance direction). A color image can be formed on the recording paper 216 by ejecting the inks from the recording heads 212K, 212C, 212M, and 212Y, respectively, onto the recording paper 216 while conveying the recording paper 216.

The printing unit 212, in which the full-line heads covering the entire width of the paper are thus provided for the respective ink colors, can record an image over the entire surface of the recording paper 216 by performing the action of moving the recording paper 216 and the printing unit 212 relative to each other in the paper conveyance direction (sub-scanning direction) just once (in other words, by means of a single sub-scan). Higher-speed printing is thereby made possible and productivity can be improved in comparison with a shuttle type head configuration in which a recording head moves reciprocally in the direction (main scanning direction) that is perpendicular to the paper conveyance.

Although a configuration with four standard colors, K M C and Y, is described in the present embodiment, the combinations of the ink colors and the number of colors are not limited to these, and light and/or dark inks can be added as required. For example, a configuration is possible in which recording heads for ejecting light-colored inks such as light cyan and light magenta are added.

As shown in FIG. 6, the ink storing and loading unit 214 has ink tanks for storing the inks of the colors corresponding to the respective recording heads 212K, 212C, 212M, and 212Y, and the respective tanks are connected to the recording heads 212K, 212C, 212M, and 212Y by means of channels (not shown). The ink storing and loading unit 214 has a warning device (for example, a display device or an alarm sound generator and the like) for warning when the remaining amount of any ink is low, and has a mechanism for preventing loading errors among the colors.

The print determination unit 224 has an image sensor (line sensor and the like) for capturing an image of the ink-droplet deposition result of the printing unit 212, and functions as a device to check for ejection defects such as clogs of the nozzles in the printing unit 212 from the ink-droplet deposition results evaluated by the image sensor.

The print determination unit 224 of the present embodiment is configured with at least a line sensor having rows of photoelectric transducing elements with a width that is greater than the ink-droplet ejection width (image recording width) of the recording heads 212K, 212C, 212M, and 212Y. This line sensor has a color separation line CCD sensor including a red (R) sensor row composed of photoelectric transducing elements (pixels) arranged in a line provided with an R filter, a green (G) sensor row with a G filter, and a blue (B) sensor row with a B filter. Instead of a line sensor, it is possible to use an area sensor composed of photoelectric transducing elements which are arranged two-dimensionally.

The print determination unit 224 reads a test pattern image printed by the recording heads 212K, 212C, 212M, and 212Y for the respective colors, and the ejection of each head is determined. The ejection determination includes the presence of the ejection, measurement of the dot size, and measurement of the dot deposition position.

A post-drying unit 242 is disposed following the print determination unit 224. The post-drying unit 242 is a device to dry the printed image surface, and includes a heating fan, for example. It is preferable to avoid contact with the printed surface until the printed ink dries, and a device that blows heated air onto the printed surface is preferable.

In cases in which printing is performed with dye-based ink on porous paper, blocking the pores of the paper by the application of pressure prevents the ink from coming contact with ozone and other substance that cause dye molecules to break down, and has the effect of increasing the durability of the print.

A heating/pressing unit 244 is disposed following the post-drying unit 242. The heating/pressing unit 244 is a device to control the glossiness of the image surface, and the image surface is pressed with a pressure roller 245 having a predetermined uneven surface shape while the image surface is heated, and the uneven shape is transferred to the image surface.

The printed matter generated in this manner is outputted from the paper output unit 226. The target print (i.e., the result of printing the target image) and the test print are preferably outputted separately. In the inkjet recording apparatus 200, a sorting device (not shown) is provided for switching the outputting pathways in order to sort the printed matter with the target print and the printed matter with the test print, and to send them to paper output units 226A and 226B, respectively. When the target print and the test print are simultaneously formed in parallel on the same large sheet of paper, the test print portion is cut and separated by a cutter (second cutter)

248. The cutter 248 is disposed directly in front of the paper output unit 226, and is used for cutting the test print portion from the target print portion when a test print has been performed in the blank portion of the target print. The structure of the cutter 248 is the same as the first cutter 228 described above, and has a stationary blade 248A and a round blade 248B. Although not shown in FIG. 6, the paper output unit 226A for the target prints is provided with a sorter for collecting prints according to print orders.

Figure 8:
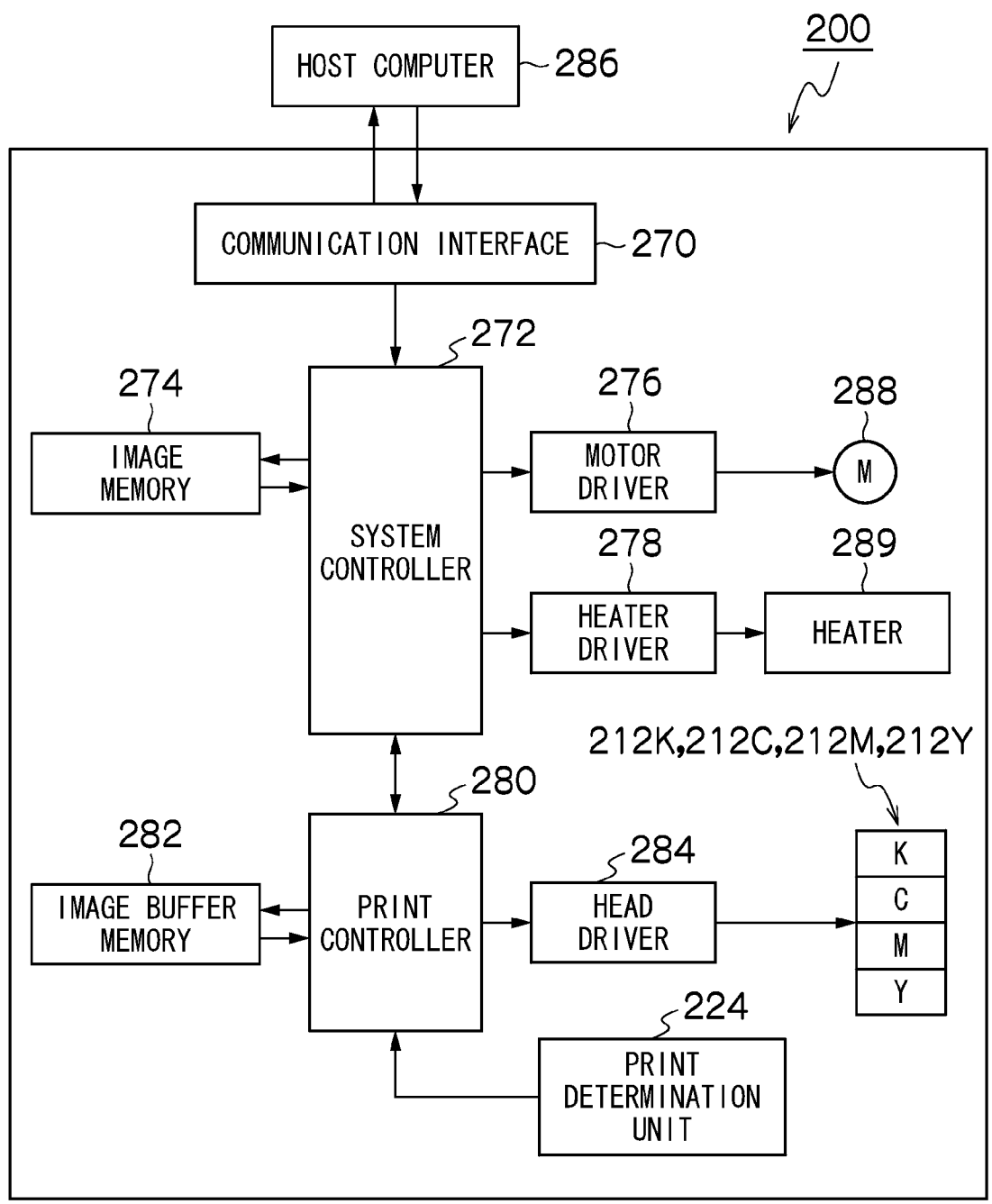
FIG. 8 is a principal block diagram showing the control system of the inkjet recording apparatus.

FIG. 8 is a principal block diagram showing the control system of the inkjet recording apparatus 200. The inkjet recording apparatus 200 has a communication interface 270, a system controller 272, an image memory 274, a motor driver 276, a heater driver 278, a print controller 280, an image buffer memory 282, a head driver 284, and the like.

The communication interface 270 is an interface unit for receiving image data sent from a host computer 286. A serial interface such as USB (Universal Serial Bus), IEEE1394, Ethernet (trademark), wireless network, or a parallel interface such as a Centronics interface may be used as the communication interface 270. A buffer memory (not shown) may be mounted in this portion in order to increase the communication speed. The image data sent from the host computer 286 is received by the inkjet recording apparatus 200 through the communication interface 270, and is temporarily stored in the image memory 274.

The image memory 274 is a storage device for temporarily storing images inputted through the communication interface 270, and data is written and read to and from the image memory 274 through the system controller 272. The image memory 274 is not limited to a memory composed of semiconductor elements, and a hard disk drive or another magnetic medium may be used.

The system controller 272 is a control unit for controlling the various sections, such as the communications interface 270, the image memory 274, the motor driver 276, the heater driver 278, and the like. The system controller 272 is constituted by a central processing unit (CPU) and peripheral circuits thereof, and the like, and in addition to controlling communications with the host computer 286 and controlling reading and writing from and to the image memory 274, or the like, it also generates a control signal for controlling the motor 288 of the conveyance system and the heater 289.

The motor driver (drive circuit) 276 drives the motor 288 in accordance with commands from the system controller 272. The heater driver (drive circuit) 278 drives the heater 289 of the post-drying unit 242 or the like in accordance with commands from the system controller 272.

The print controller 280 has a signal processing function for performing various tasks, compensations, and other types of processing for generating print control signals from the image data stored in the image memory 274 in accordance with commands from the system controller 272 so as to supply the generated print control signal (dot data) to the head driver 284. Prescribed signal processing is carried out in the print controller 280, and the ejection amount and the ejection timing of the ink from the respective recording heads 212K, 212C, 212M, and 212Y are controlled via the head driver 284, on the basis of the print data. By this means, prescribed dot size and dot positions can be achieved.

The print controller 280 is provided with the image buffer memory 282; and image data, parameters, and other data are temporarily stored in the image buffer memory 282 when image data is processed in the print controller 280. The aspect shown in FIG. 8 is one in which the image buffer memory 282 accompanies the print controller 280; however, the image memory 274 may also serve as the image buffer memory 282. Also possible is an aspect in which the print controller 280 and the system controller 272 are integrated to form a single processor.

The head driver 284 generates drive signals for driving the piezoelectric elements 36 (see FIG. 1) of the recording heads 212K, 212C, 212M, 212Y of the respective colors, on the basis of the dot data supplied from the print controller 280, and supplies the generated drive signals to the piezoelectric elements 36. It is also possible to include a feedback control system in the head driver 284 in order to maintain uniform drive conditions of the recording heads 212K, 212C, 212M and 212Y.

The print determination unit 224 is a block that includes the line sensor as described above with reference to FIG. 6, reads the image printed on the recording paper 216, determines the print conditions (presence of the ejection, variation in the dot formation, and the like) by performing desired signal processing, or the like, and provides the determination results of the print conditions to the print controller 280.

According to requirements, the print controller 280 makes various corrections with respect to the recording head 212K, 212C, 212M and 212Y on the basis of information obtained from the print determination unit 224.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of manufacturing a piezoelectric actuator which includes a piezoelectric device constituted of a lower electrode, a piezoelectric body and an upper electrode arranged on a diaphragm, the method comprising:
   a polishing step of polishing the piezoelectric body which is in a polarized state caused by a first polarization;
   a first heating step of heating the piezoelectric body having been polished in the polishing step to a temperature which is not lower than a Curie point of the piezoelectric body; and
   a re-polarization step of performing a second polarization of the piezoelectric body having been heated in the first heating step.

2. The method as defined in claim 1, further comprising a second heating step of heating the piezoelectric body before the first heating step to a temperature which is not lower than 100° C. and is lower than the Curie point of the piezoelectric body.

3. The method as defined in claim 2, further comprising an upper electrode formation step of forming the upper electrode on the piezoelectric body, the second heating step being performed while the upper electrode is formed.

4. The method as defined in claim 1, wherein the piezoelectric body is a bulk piezoelectric body.

5. The method as defined in claim 1, further comprising a first polarization step of performing the first polarization of the piezoelectric body before the polishing step.

* * * * *